United States Patent [19]

Bunkenburg et al.

[11] Patent Number: 4,854,337
[45] Date of Patent: Aug. 8, 1989

[54] APPARATUS FOR TREATING WAFERS UTILIZING MEGASONIC ENERGY

[75] Inventors: Joachim Bunkenburg, Victor; Peter M. Hammond, Rochester, both of N.Y.

[73] Assignee: Eastman Kodak Company, Rochester, N.Y.

[21] Appl. No.: 197,867

[22] Filed: May 24, 1988

[51] Int. Cl.⁴ .................................. B08B 3/12
[52] U.S. Cl. ............................. 134/184; 134/1
[58] Field of Search .................... 134/1, 58 R, 184

[56] References Cited

U.S. PATENT DOCUMENTS 4,705,054  11/1987  Fields ........................... 134/184 X
4,736,760   4/1988  Coberly et al. ................. 134/184 X Primary Examiner—Philip R. Coe
Attorney, Agent, or Firm—Robert L. Randall

[57] ABSTRACT

Apparatus for treating the surfaces of a plurality of wafers, such as semiconductor wafers, which comprises a container of treatment fluid having an open upper side for accepting a cassette containing a plurality of vertically disposed wafers. The cassette is supported in the fluid in said container and a transducer carrier is mounted in the lower portion of the container. The carrier has at least one megasonic transducer arranged to project a beam of ultrasonic energy upwardly over the vertical surfaces of the wafers. The transducer carrier is moved parallel with the wafer surfaces transversely of the container whereby the ultrasonic energy beam contacts and treats the entire surface of all of the wafers therein.

12 Claims, 1 Drawing Sheet

APPARATUS FOR TREATING WAFERS UTILIZING MEGASONIC ENERGY

BACKGROUND OF THE INVENTION

1. Field of the Invention

The present invention is directed to the field of surface cleaning and etching of wafers such as silicon substrates and, more particularly, to an improved apparatus for enhancing the process of treating a plurality of semiconductor wafers.

2. Description Relative to the Prior Art

The use of ultrasonic energy to enhance the cleaning action of solutions used on semiconductor wafers is well established and has been described in U.S. Pat. Nos. 3,198,489, 3,240,963, 3,893,869 and 4,401,131. Ultrasonic agitation has also been used to enhance the etching action of etching solutions on similar semiconductor wafers. Such cleaning and etching processes are now commonly used in the production of semiconductor devices and have used transducers operating at both intermediate frequencies, i.e., 20–50 KHz, and, more recently, frequencies of 0.2 to 5.0 MHz. As noted in U.S. Pat. No. 4,602,184, the use of the high frequency, or megasonic, agitation of the solutions has resulted in improved cleaning and etching, paticularly on wafers with very small, micron-sized components or elements thereon. Further, the use of such high frequency agitation has resulted in a gentler cleaning action on the wafers than that obtained with intermediate frequency agitation. As a result, damage to the micro-sized components during the etching and cleaning operations during the production of the semiconductor wafers has been significantly reduced with the use of high frequency agitation. The productivity of the semiconductor production system has thus been improved due to the reduction in damage to the elements on the semiconductor wafers.

Various attempts have been made to provide high frequency agitation to tank-type cleaning and etching baths with megasonic-frequency-generating transducers mounted to the inner surface of the tank walls. Some of these arrangements have employed apparatus to move the wafer-containing cassettes through the energy beam created by the transducers to assure that all portions of the wafer surfaces have been treated by the energy beam to insure that they have been adequately treated. Such arrangements have been found to be less than satisfactory due to the fact that the tank must be sufficiently large to permit the movement of the cassettes past the transducers, requiring larger tanks and more space in the clean rooms normally used for such processes, to provide space necessary for such cassette movement. Moreover, the larger tank volume requires a significantly larger volume of cleaning or etching fluid to fill the tank. Further, it has been found that the movement of the cassette containing the semiconductor wafers has caused edge damage to the wafers because of the motion of the cassettes and the wafers through the cleaning or etching bath. Still further, it has been found that due to the high power operation of the transducers, they must be replaced regularly. This has proven to be a time consuming and costly task with cleaning systems of the prior art, often requiring the emptying of the tank of the highly reactive fluid therein.

Thus, a megasonic cleaning and etching device obviating the foregoing problems, providing higher wafer yield with less damage to the wafers, permitting smaller space requirements and less fluid use, as well as easier transducer maintenance, will achieve widespread acceptance in the semiconductor manufacturing industry.

SUMMARY OF THE INVENTION

Accordingly, the present invention provides apparatus for treating the surfaces of a plurality of semiconductor wafers comprising a container means arranged to hold a body of a cleaning or etching fluid. The container has an open upper side for accepting a cassette containing a plurality of vertically disposed semiconductor wafers. Means is provided for supporting the cassette with the semiconductor wafers carried thereby beneath the surface of the fluid in said container. A transducer carrier is mounted in the container. The carrier has at least one megasonic transducer arranged to project a beam of ultrasonic energy over the vertical surfaces of the semiconductor wafers, and means is provided for energizing the megasonic transducer to oscillate at a frequency of between about 0.2 and 0.5 MHz. Means is also provided for moving the transducer carrier parallel with the semconductor wafer surfaces transversely of the container whereby the ultrasonic energy beam contacts and treats the entire surface of all of the semiconductor wafers therein.

Moreover, the present invention provides an apparatus in which the transducer may be easily and quickly serviced, without requiring that the cleaning or etching fluid be first removed from the container.

Various means for practicing the invention and other features and advantages thereof will be apparent from the following detailed description of illustrative preferred embodiments of the invention, reference being made to the accompanying drawings.

DETAILED DESCRIPTION OF THE PREFERRED EMBODIMENT

Figure 1:
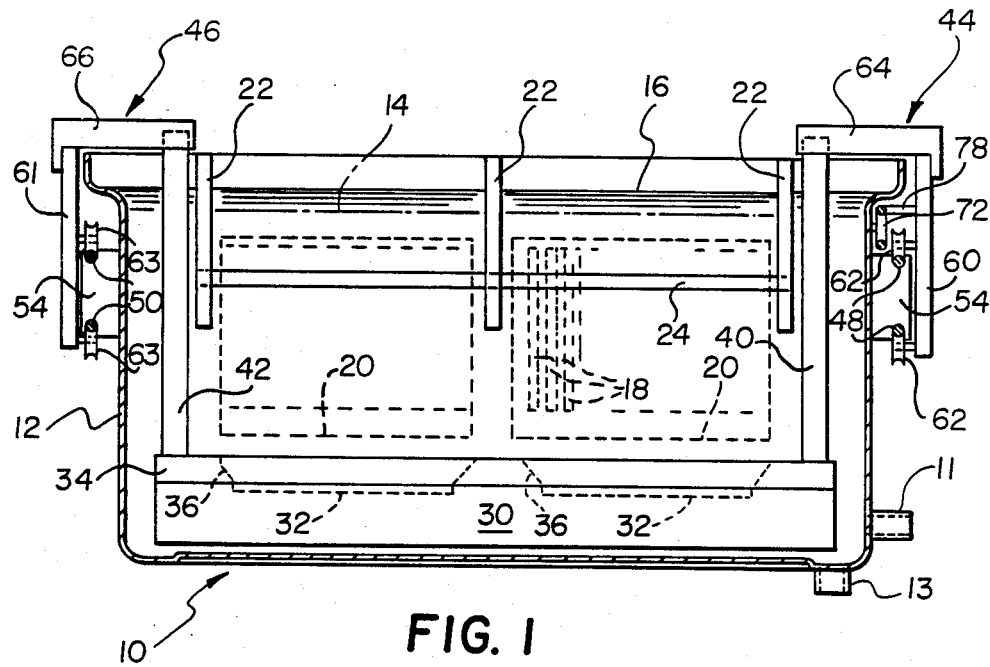
FIG. 1 is a side sectional elevation of the semiconductor treating apparatus of the present invention.
Figure 2:
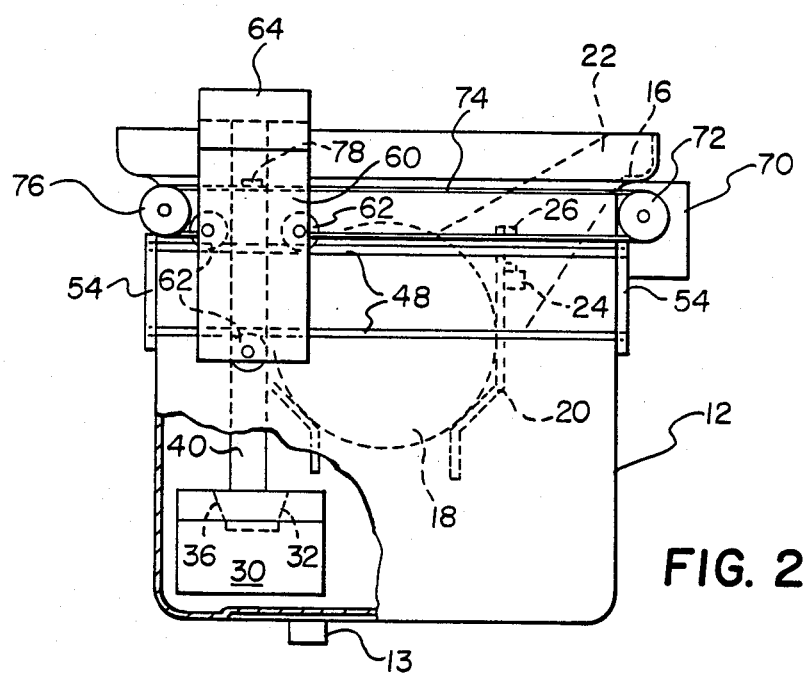
FIG. 2 is an end elevational view, partially in section, of the apparatus illustrated in FIG. 1.

Referring now to FIG. 1 of the drawing, a preferred embodiment of the novel megasonic semiconductor treatment apparatus 10 is illustrated. The apparatus comprises a container means or tank 12 arranged to have an open upper surface and containing a treatment fluid for treating semiconductor wafers. The container means is provided with an inlet 11 and a drain 13 for adding or removing treatment fluid, as necessary, to achieve a liquid level 14. The tank is provided with a flared upper edge forming a ledge 16 about the upper periphery thereof. The semiconductor wafers 18, shown in phantom, are disposed vertically in parallel relationship in a wafer-carrying cassette supporting means 20, also shown in phantom. (Neither the semiconductor wafers nor the wafer-carrying cassette form a part of the present invention, but are shown to illustrate their location in the treatment apparatus of the present invention.) A cassette-supporting means comprises a plurality of transverse hanger plate members 22, arranged to be supported by the ledge 16 at the upper side of the container means 12. The hanger plates are spaced apart a distance slightly greater than the length of a wafer-carrying cassette and are interconnected by longitudinally extending hanger bars 24, only one of which is shown. A flange 26 on the outer surface of the cassette 20 is arranged to engage and be supported by bars 24, supporting the semiconductor wafers 18 below the surface of the treatment fluid in the container means.

A transducer carrier 30 is suspended in the lower portion of the container tank 12 and is arranged to be moved beneath the cassettes 20 (two of which are illustrated in FIG. 1) and semiconductor wafers 18, as will be described hereinafter. The transducer carrier is shown as containing a pair of megasonic transducers 32, each disposed beneath a respective wafer-carrying cassette 20, substantially as illustrated. A cover member 34 is disposed over the upper surface of the transducers 32 providing a hermetic seal for the components carried by transducer carrier 30. The cover 34 is provided with openings 36 over each of the transducers 32 to permit the direct radiation of the ultrasonic energy therefrom upwardly into the treatment fluid. The transducer carrier 30 extends the full length of the container tank 12 but has a width only a fraction of the width of the container.

The transducer carrier 30 is suspended above the bottom of the tank by a pair of substantially vertical tubular members 40 and 42 at opposite ends thereof. The tubular members are sealed to the carrier and extend upwardly to above the top of the tank where they are hung from carriage members 44 and 46, at either end of the tank.

A pair of rails 48 and 50 are provided at each end of the tank and are arranged parallel with each other and with the bottom of the tank. The rails are supported by brackets 54 which extend from the tank to space the rails from the end thereof.

Each carriage member, 44 and 46, comprises an upright member 60 and 61, each carrying a set of wheels or rollers, 62 and 63 which are arranged to engage and ride on rails 48 and 50, respectively. Each of the upright members extends above the upper edge of the tank 12 where it is joined to a crossover member 64 and 66. Each of the crossover members extends over the top edge of the tank from the upright member 60 and 61, to the tubular members 40 and 42 which are joined thereto. The crossover members are connected to the upright members with removable fasteners, such as bolts, not shown, to permit the disconnection of the crossover members from the upright members.

A drive motor 70 is arranged at one end of the tank 12 and is provided with a drive sheave 72 which engages and drives a drive belt 74. The drive belt 74 extends across the end of the tank 12 to a return sheave 76 and is connected to the carriage member 60 by means of a clip 78.

The megasonic transducers 32 are provided with power via leads, not shown, which extend to the transducer carrier through the tubular members 40 and 42. Since the tubular members 40 and 42 are sealed at their connection with the transducer carrier 30, the leads are protected from the environment of the bath within tank 12. Suitable instrumentation and control leads may also be supplied to the transducer carrier through the tubular members.

In the operation of the present device, the tank is filled with the appropriate fluid to a level approximating that indicated at 14, and a wafer-carrying cassette 20 is lowered into the bath to be supported by the hanger rods 24 which engage the flanges 26 on the outer face of the cassette. The semiconductor wafers 18 are thus disposed vertically in the bath above the transducer carrier 30. The ultrasonic transducer 32 are then actuated along with the drive motor 70 which traverses the transducer carrier back and forth beneath the semiconductor wafers in the bath. The intense beam of megasonic waves are projected upward from the transducers 32 and contact the surfaces of the semiconductor wafers 18 as the carrier is moved back and forth beneath the wafer-carrying cassette 20. With the present invention, the entire surface of the semiconductor wafers can be uniformly treated by the megasonic beam generated by transducers 32 without any intervention of tank walls and without unnecessary movement of the wafers in the bath.

Should it be desirable or necessary to service the transducers, this is simply done by removing the cassette supporting means, comprising the hanger plates and bars 22 and 24, from the tank 12 by lifting it out. The crossover members 64 and 66 are disconnected from the respective upright members 60 and 61, and the entire transducer carrier assembly can be lifted from the bath. Accordingly, it is not necessary to drain the bath or otherwise service the transducers in the bath.

ALTERNATIVE EMBODIMENTS

While the preferred embodiment has been described as providing substantially uniform treatment to the surfaces of the semiconductors, it will be understood that the drive motor 70 may be controlled so as to provide non-uniform exposure of the semiconductor wafers to the ultrasonic beam. This might be necessary or desirable when it is found that the semiconductor wafers contain portions which are more difficult to clean or etch than other portions.

It should also be noted that while only a single drive member 72 is illustrated, providing the transducer carrier with a drive force from only one end of the tank, it will be apparent that a shaft can be extended from the motor 70 to the opposite end of the tank thereby supplying the transducer carrier means with driving force uniformly from both ends thereof.

While the foregoing description has been specifically directed to apparatus for the treatment of semiconductor wafers, it will be understood that it can be also used fro other types of wafer structures or substrates needing particle removal, such as photomask plates, memory disks (optical or magnetic), solar cells, or optical components.

It will thus be seen that the present invention provides a semiconductor treatment apparatus which reduces the movement of the semiconductor wafers and the attendant damage thereto, while still providing uniform exposure of the wafers to the action of the ultrasonic energy generated by the movement of the megasonic transducers through the bath beneath the wafers. Moreover, it will be seen that with the construction of the the present invention, service of the transducers is significantly improved with an attendant reduction in time and cost.

The invention has been described in detail with particular reference to a presently preferred embodiment, but it will be understood that variations and modifications can be effected within the spirit and scope of the invention.

What is claimed is:

1. Apparatus for treating the surfaces of a plurality of wafers comprising a container means arranged to hold a body of treatment fluid, said container means having an open upper side for accepting a cassette containing a plurality of vertically disposed wafers, means for supporting said cassette from the open upper side of said container with the wafers carried thereby beneath the surface of the treatment fluid in said container, a transducer carrier suspended from the open upper side of said container in said container, said carrier being suspended above the bottom of said container beneath the wafers and having a megasonic transducer arranged to project a beam of ultrasonic energy upwardly over the vertical surfaces of said wafers, said transducer carrier having a width substantially less than the width of said cassette, means for energizing said megasonic transducer to oscillate at a frequency of between about 0.2 and 5 MHz, and means for moving said transducer carrier transversely of its width parallel with the wafer surfaces and transversely of the container whereby said ultrasonic energy beam contacts and treats the entire surface of the wafers therein.

2. The invention according to claim 1, wherein said moving means is arranged to move said carrier while the transducer is energized.

3. The invention according to claim 2 wherein said moving means is variably controlled to selectively apply said ultrasonic energy beam to selected portions of said wafers.

4. The invention according to claim 2, wherein some portions of the wafers receive more contact by the ultrasonic energy beam than do other portions.

5. The invention according to claim 1, wherein said means for moving said transducer carrier includes motor means disposed exteriorly of said container means, and means for drivingly connecting said motor means to said transducer carrier.

6. The invention according to claim 5 wherein said driving connection means includes rail means disposed in parallel relation on opposite sides of said container means, and carriage means disposed upon said rail means and extending over the top edge of said container means, and means for suspending said transducer carrier from said carriage means.

7. The invention according to claim 6, wherein said suspension means includes tubular members hermetically sealed to said transducer carrier and arranged to carry electrical leads to said transducer carrier.

8. The invention according to claim 7 wherein said cassette supporting means is readily removable from said container means.

9. The invention according to claim 8 wherein said carriage means is separable to permit said transducer carrier to be lifted from said container means.

10. The invention according to claim 7 wherein said carriage means is separable to permit said transducer carrier to be lifted from said container means.

11. The invention according to claim 1 wherein said cassette supporting means is readily removable from said container means.

12. The invention according to claim 1, wherein said carrier is provided with a plurality of megasonic transducers arranged to project a beam of ultrasonic energy over the surfaces of the wafers.

* * * * *